United States Patent
Huang et al.

(10) Patent No.: US 8,945,344 B2
(45) Date of Patent: Feb. 3, 2015

(54) SYSTEMS AND METHODS OF SEPARATING BONDED WAFERS

(75) Inventors: Xin-Hua Huang, Xihu Township (TW); Ping-Yin Liu, Yonghe (TW); Hung-Hua Lin, Taipei (TW); Yuan-Chih Hsieh, Hsin-Chu (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 13/554,751

(22) Filed: Jul. 20, 2012

(65) Prior Publication Data

US 2014/0020818 A1 Jan. 23, 2014

(51) Int. Cl.
*B32B 38/10* (2006.01)

(52) U.S. Cl.
USPC ........... 156/707; 156/711; 156/718; 156/752; 156/758; 156/763; 156/930; 156/941; 438/458

(58) Field of Classification Search
USPC ......... 156/714, 707, 711, 752, 758, 930, 941, 156/718, 763
See application file for complete search history.

(56) References Cited

U.S. PATENT DOCUMENTS

| | | | | |
|---|---|---|---|---|
| 5,447,596 | A * | 9/1995 | Hayase | 156/750 |
| 6,418,999 | B1 * | 7/2002 | Yanagita et al. | 156/756 |
| 6,534,383 | B1 * | 3/2003 | Iwane et al. | 438/458 |
| 6,860,963 | B2 * | 3/2005 | Yanagita et al. | 156/755 |
| 8,267,143 | B2 | 9/2012 | George et al. | |
| 8,506,832 | B2 * | 8/2013 | Jin et al. | 216/53 |
| 2004/0171233 | A1 * | 9/2004 | Ohmi et al. | 438/458 |
| 2010/0129658 | A1 * | 5/2010 | Suzuki et al. | 428/411.1 |
| 2013/0269879 | A1 * | 10/2013 | Hirakawa et al. | 156/711 |

FOREIGN PATENT DOCUMENTS

| | | |
|---|---|---|
| JP | 02263437 A | 10/1990 |
| JP | 2004241568 | 8/2004 |
| KR | 20120027237 A | 3/2012 |
| WO | WO 2012093574 A1 * | 7/2012 |

\* cited by examiner

*Primary Examiner* — Mark A Osele
(74) *Attorney, Agent, or Firm* — Slater & Matsil, L.L.P.

(57) ABSTRACT

Systems and methods of separating bonded wafers are disclosed. In one embodiment, a system for separating bonded wafers includes a support for the bonded wafers and means for applying a sheer force to the bonded wafers. The system also includes means for applying a vacuum to the bonded wafers.

16 Claims, 6 Drawing Sheets

SYSTEMS AND METHODS OF SEPARATING BONDED WAFERS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of decreased length of interconnects between the stacked dies, as examples.

Some methods of forming 3DICs involve bonding together two semiconductor wafers. Wafers may be bonded together using fusion bonding, eutectic bonding, and hybrid bonding, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to de-bonding wafers that have been bonded together. Novel systems 120 (see FIG. 3) and methods of separating bonded wafers will be described herein.

Figure 1:
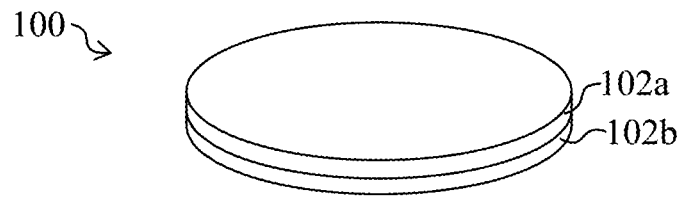
FIG. 1 is a perspective view of two wafers bonded together in accordance with an embodiment of the present disclosure.

Referring first to FIG. 1, there is shown a perspective view of bonded wafers 100 that include two wafers 102a and 102b that have been bonded together in accordance with an embodiment of the present disclosure. Each of the wafers 102a and 102b comprises a semiconductor wafer or other type of wafer or workpiece. The wafers 102a and 102b are bonded together in a 3DIC packaging process, for example. The wafers 102a and 102b are bonded together using eutectic bonding, hybrid bonding, fusion bonding, anodic bonding and/or thermo-compression bonding, as examples. Alternatively, the wafers 102a and 102b may be bonded together using other wafer-to-wafer bonding techniques.

Figure 2:
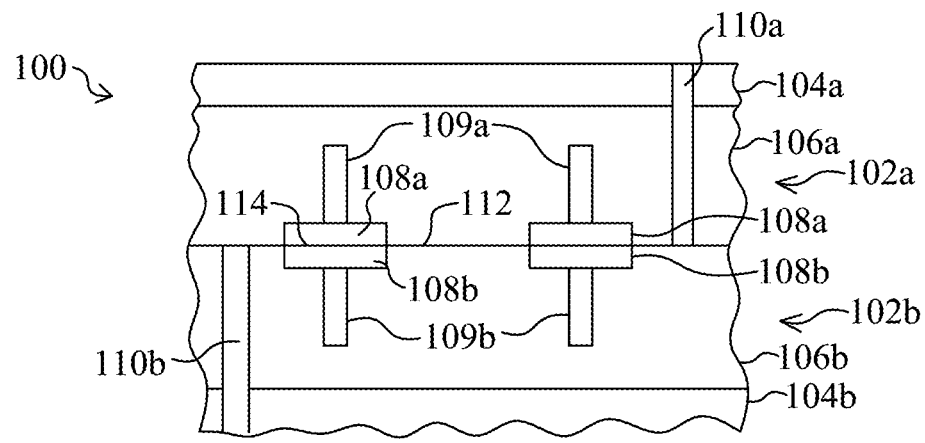
FIG. 2 is a more detailed cross-sectional view of the bonded wafers shown in FIG. 1.

FIG. 2 is a more detailed cross-sectional view of the bonded wafers 100 shown in FIG. 1. Each of the wafers 102a and 102b includes a workpiece 104a and 104b, respectively. The workpieces 104a and 104b may include a semiconductor substrate comprising silicon or other semiconductor materials and may be covered by an insulating layer, for example. The workpieces 104a and 104b may also include other active components or circuits, not shown. The workpieces 104a and 104b may comprise silicon oxide over single-crystal silicon, for example. The workpieces 104a and 104b may include conductive layers and semiconductor elements, such as transistors, diodes, capacitors, etc. Compound semiconductors, GaAs, InP, Si/Ge, or SiC, as examples, may be used in place of silicon. The workpieces 104a and 104b may each comprise a silicon-on-insulator (SOI) or a germanium-on-insulator (GOI) substrate, as examples.

Each wafer 102a and 102b is fabricated separately and later bonded to the other wafer 102b or 102a. The wafers 102a and 102b may comprise the same or similar types of devices. Alternatively, the wafers 102a and 102b may comprise different types of devices formed thereon.

The wafers 102a and 102b include an insulating material 106a and 106b, respectively, formed at a top surface thereof. Wafer 102a is inverted prior to bonding the wafers 102a and 102b together, as illustrated in FIG. 2. Alternatively, wafer 102a may not be inverted, not shown. Conductive lines or contact pads 108a and 108b, respectively, are formed in the insulating materials 106a and 106b of the wafers 102a and 102b. Vias 109a and 109b, respectively, may also be formed in the insulating materials 106a and 106b of the wafers 102a and 102b. The top portion of the wafers 102a and 102b may comprise metallization layers, for example.

The insulating materials 106a and 106b may comprise silicon dioxide, silicon nitride, other types of insulating material layers, or multiple layers or combinations thereof, as examples. The conductive lines or contact pads 108a and 108b and vias 109a and 109b may comprise Cu, Al, seed layers, liners, other materials, or multiple layers or combinations thereof, as examples. Alternatively, the conductive lines or contact pads 108a and 108b, vias 109a and 109b, and insulating materials 106a and 106b may comprise other materials. Each of the wafers 102a and 102b may comprise multiple layers of conductive lines and vias, not shown.

The wafers 102a and 102b may further include through substrate vias (TSVs) 110a and 110b, respectively, comprised of conductive or semiconductive materials in some embodiments, as examples. The TSVs provide electrical connections vertically from top to bottom surfaces of each of the wafers 102a and 102b, for example. Alternatively, the TSV's may comprise other materials.

During the bonding of the wafers 102a and 102b, insulator-to-insulator bonds 112 and/or metal-to-metal bonds 114 are formed therebetween. The insulator-to-insulator bonds 112 are formed between the insulating materials 106a and 106b, and the metal-to-metal bonds 114 are formed between the conductive lines 108a and 108b. In some applications, only insulator-to-insulator bonds 112 are formed, or only metal-to-metal bonds 114 are formed, for example, depending on the type of bonding process.

After the bonding process for the bonded wafers 100 is at least partially completed, the bonded wafers 100 are inspected. If it is determined that there has been a problem with the bonding of the wafers 102a and 102b, such as areas where the bonding process was not successful, the desired bonding quality was not achieved, or defects are detected, as examples, it is desirable in some applications to de-bond the wafers 102a and 102b, to separate them so that one or both of the wafers 102a and 102b can be re-worked and re-used, e.g., in another wafer bonding process or other application. In accordance with embodiments of the present disclosure, novel systems and methods are used to de-bond or separate the bonded wafers 100, to be described further herein.

In some embodiments, the bonded wafers 100 are de-bonded before the wafer bonding process is completed, for example. The bonded wafers 100 are de-bonded within about an hour or less of the initial bonding procedure in some embodiments. The metal-to-metal bonds 114 and the insulator-to-insulator bonds 112 strengthen with time in some applications and bonding procedures, for example, and thus, de-bonding the bonded wafers 100 is easier if the process is performed shortly after the bonding process. The Q time is less than about an hour between the bonding station and the de-bonding station (e.g., comprising system 120, shown in FIG. 3) in some embodiments, as another example.

In other embodiments, the bonded wafers 100 are de-bonded before an anneal process that is used to strengthen the metal-to-metal bonds 114 and/or the insulator-to-insulator bonds 116, as another example. The bonded wafers 100 are de-bonded before other post-bonding processes in accordance with other embodiments.

Figure 3:
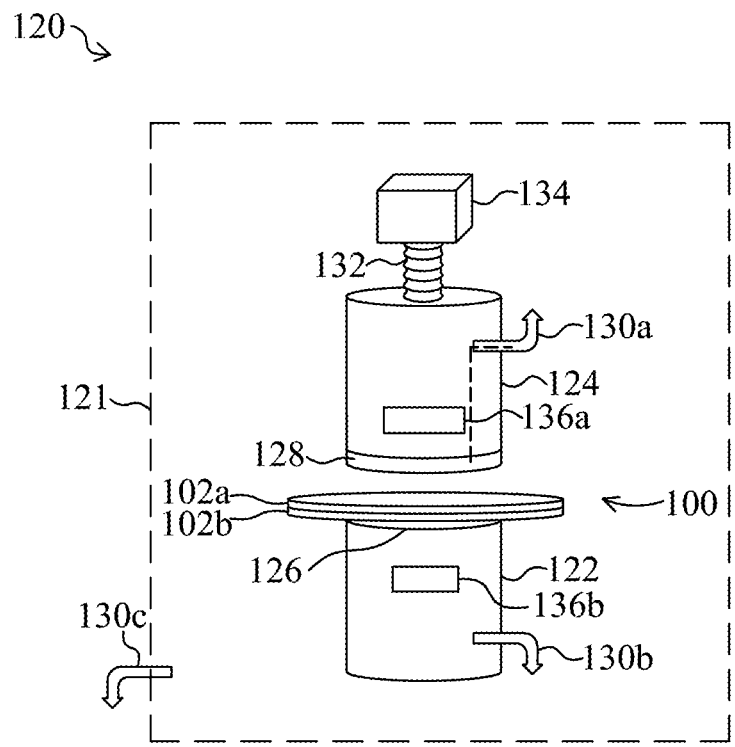
FIG. 3 is an illustration of a system for separating wafers in accordance with an embodiment.

FIG. 3 is an illustration of a system 120 for separating bonded wafers 100 in accordance with an embodiment. The system 120 for separating bonded wafers 100 includes a support 126 for the bonded wafers 100, means for applying a sheer force to the bonded wafers 100, and means for applying a vacuum to the bonded wafers 100. The means for applying the vacuum is adapted to lift a top wafer 102a of the bonded wafers 100 from a bottom wafer 102b of the bonded wafers 100 on the support 126 for the bonded wafers 100 in an embodiment. The means for applying the sheer force includes the means for applying the vacuum to the bonded wafers 100, in some embodiments.

The means for applying the vacuum comprises a first means for applying a first vacuum, and the system 120 further comprises a second means for applying a second vacuum in some embodiments. The first means for applying the first vacuum is adapted to apply the first vacuum to a first wafer 102a of bonded wafers 100 and the second means for applying the second vacuum is adapted to apply the second vacuum to a second wafer 102b of the bonded wafers 100 in an embodiment.

The system 120 further comprises a third means for applying a third vacuum in other embodiments. The system may include a chamber 121 enclosing the support 126 for the bonded wafers 100, the first means for applying the first vacuum, the second means for applying the second vacuum, and the means for applying the sheer force. The third means for applying the third vacuum is coupled to the chamber 121 in an embodiment. The means for applying the various vacuums includes vacuum lines 130a, 130b, and 130c which are coupled to one or more vacuum pumps (not shown), in some embodiments.

In other embodiments, the system 120 for separating bonded semiconductor wafers 100 includes the chamber 121, a first stage 122 disposed in the chamber 121, and a second stage 124 disposed in the chamber 121 proximate the first stage 122. The first stage 122 comprises a lower, fixed stage and the second stage 124 comprises an upper, moveable stage in some embodiments. The first stage 122 includes a first vacuum line 130b and is adapted to support the bonded semiconductor wafers 100. The first stage 122 includes the support 126, for example. The support 126 may comprise a plate or grating comprised of a metal or other material, for example. The second stage 124 includes a second vacuum line 130a. A ball screw 132 is coupled to the second stage 124, and a servo motor 134 is coupled to the ball screw 132. A third vacuum line 130c is coupled to the chamber 121.

The servo motor 134 includes an electric motor adapted to provide a rotary output and a position controller in an embodiment. The ball screw 132 comprises a mechanical linear actuator that translates rotational motion of the servo motor 134 to linear motion in an embodiment. The ball screw 132 may include a threaded shaft and ball bearings, for example. Alternatively, other types of motors 134 and linear actuators may be used.

In some embodiments, the second vacuum line 130a of the second stage 124 is coupled to a vacuum disk 128, as shown in phantom in FIG. 3. The second vacuum line 130a may alternatively be coupled to other means for applying a vacuum to a top surface of a top wafer 102a of the bonded wafers 100. The first stage 122 is fixed and the second stage 124 is moveable in some embodiments. The first stage 122 or the second stage 124 may include a heater 136b and 136a, respectively, in some embodiments. In some embodiments, both the first stage 122 and the second stage 124 include a heater 136b and 136a, for example. In other embodiments, a heater 136a and 136b is not included in the system 120, as another example.

The servo motor 134 is adapted to rotate the ball screw 132. The ball screw 132 is lowered and raised by the rotation thereof. During the de-bonding process, the second stage 124 is lowered and rotated by the servo motor 134 and the ball screw 132 so that the vacuum disk 128 makes contact with the top surface of the top wafer 102a of the bonded wafers 100. A vacuum pump (not shown) coupled to the vacuum line 130a applies a vacuum to the vacuum disk 128 and lifts the top wafer 102a. A vacuum pump, which may comprise the same or a different vacuum pump as the vacuum pump coupled to the vacuum line 130a, is coupled to the vacuum line 130b coupled to the first stage 122. The vacuum applied to the first stage 122 retains the bottom wafer 102b on the support 126 of the first stage 122 while a vacuum is simultaneously applied to the top wafer 102a by the second stage 124, during the de-bonding process. The servo motor 134 is then activated in an opposite direction, rotating the top wafer 102a and causing a sheer force or twisting force to be applied to the bonded wafers 100, which separates the wafers 102a and 102b of the bonded wafers 100. The top wafer 102a and the bottom wafer 102b are then removed from the system 120 and may be reworked, re-bonded to another wafer 102a or 102b, or used in a different application, in some embodiments.

In some embodiments, a vacuum is also applied to the chamber 121 using the vacuum line 130c before and/or during the bonding process. The vacuum line 130c may be coupled to the same vacuum pump that vacuum lines 130a and 130b are coupled to, for example. The vacuum lines 130a, 130b, and 130c may be coupled to different vacuum pumps or the same vacuum pumps, as examples. Applying the vacuum to the chamber 121 may comprise applying a vacuum or pressure of about 0.01 to 955 mbar in some embodiments, as an example. In other embodiments, applying the vacuum to the chamber 121 may comprise applying a vacuum level that is close to or substantially the same as a vacuum level that was applied to the wafers 102a and 102b during the bonding process used to bond the wafers 102a and 102b, as an example. The vacuum applied to the chamber 121 may be greater than about 955 mbar or less than about 0.01 mbar in other embodiments, for example. Alternatively, other levels of pressure may be applied to the chamber 121.

The bonded wafers 100 are heated in some embodiments using heater 136a, heater 136b, or both heaters 136a and 136b. The bonded wafers 100 are heated to a temperature of about 600 degrees C. or less while applying the twisting force to the top wafer 102a to separate the bonded wafers 100 in some embodiments, as an example. Alternatively, the bonded wafers 100 may not be heated, or the bonded wafers 100 may be heated to other temperatures before and/or during the de-bonding process used to separate the bonded wafers 100.

Figure 4:
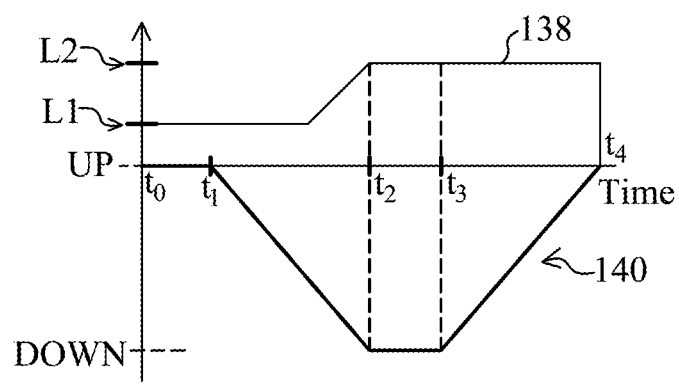
FIG. 4 is a graph illustrating the movement of an upper stage of the system shown in FIG. 3 at various times while separating wafers in accordance with an embodiment.

FIG. 4 is a graph 140 illustrating the position and movement of the second stage 124 (the upper stage) of the system 120 shown in FIG. 3 at various times while separating bonded wafers 100 in accordance with an embodiment. A graph 138 of the vacuum level of the vacuum disk 126 of the second stage 124 is also shown in FIG. 4. FIGS. 3 and 5 through 7 illustrate the system 120 at the various times shown in FIG. 4 during the separation of the bonded wafers 100 in accordance with an embodiment. An example of operation of the novel system 120 in accordance with an embodiment of the present disclosure will next be described with reference to FIGS. 3 through 7.

First, the bonded wafers 100 are placed on the support 126 of the first stage 122, as shown in FIG. 3. Initially, at time $t_0$, the second stage 120 is in the up position and the vacuum level of the vacuum disk 128 is set to a first level L1. The first level L1 may comprise about 60 kPa, for example, although other pressure levels may alternatively be used. In an embodiment, the first level L1 may comprise an off position, as another example. The chamber 121 vacuum is set to a high level which in an embodiment comprises substantially the same pressure the wafers 102a and 102b were bonded at. The first stage 122 vacuum is turned on to hold the bonded wafers 100 in place. The first stage 122 vacuum affixes the bottom side of the bonded wafers 100 to the first stage 122 during the de-bonding process.

Figure 5:
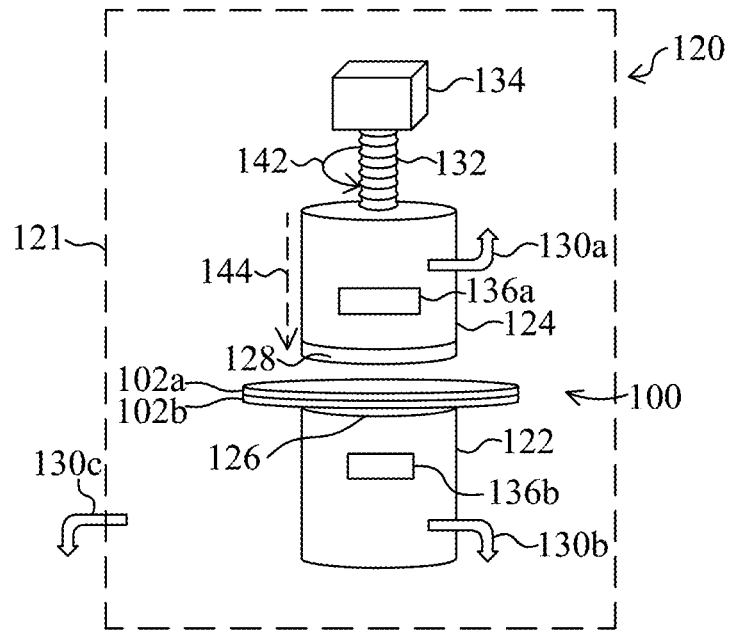
FIGS. 5 through 7 illustrate the system shown in FIG. 3 at various times during the separation of the wafers in accordance with an embodiment.

At time $t_1$, the servo motor 134 is turned on or activated, rotating the ball screw 132 as shown at 142 and initiating downward movement 144 of the second stage 124, illustrated in FIG. 5. The second stage 124 also rotates as it is lowered. The servo motor 134 drives the ball screw 142, providing linear movement (comprising downward movement 144) and rotational movement 142 to the vacuum disk 128 on the second stage 124. The downward movement 144 is continued until the vacuum disk 128 of the second stage 124 contacts the top surface of the top wafer 102a of the bonded wafers 100, shown in FIG. 6. The level of the vacuum disk 128 remains at the first level L1 at time $t_1$. Prior to time $t_2$, the level of the vacuum disk 128 is switched to the second level L2.

Figure 6:
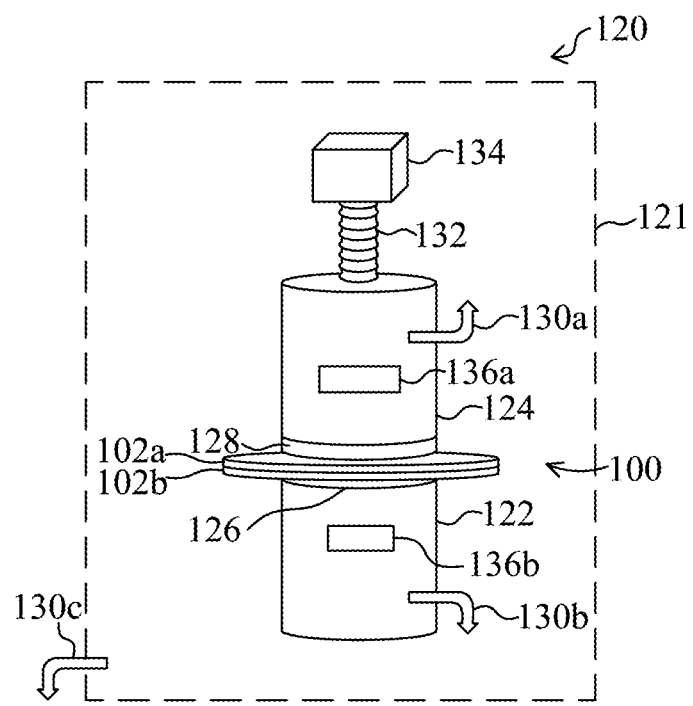

Contact of the second stage 124 with the top surface of the bonded wafers 100 occurs at time $t_2$ in graph 140 of FIG. 4, at which time the movement of the servo motor 134 is stopped and the second stage 124 has reached the down position, shown in FIG. 6. The servo motor 134 is adapted to stop at a predetermined stop position at time $t_2$ in some embodiments, for example. The servo motor 134 may be adapted to detect when contact has been made with the bonded wafers 100 in other embodiments. The vacuum disk 128 has reached the second level L2 by time $t_2$. The second level L2 comprises a vacuum level that is higher than the first level L1. The second level L2 may comprise about 100 kPa, for example, although other pressure levels may alternatively be used for the second level L2. Increasing the level to level L2 of the vacuum of the vacuum disk 128 prevents or reduces slipping of the vacuum disk 128 during the application of a sheer force 150 (see FIG. 7) to separate the wafers 102a and 102a of the bonded wafers 100, for example.

Figure 7:
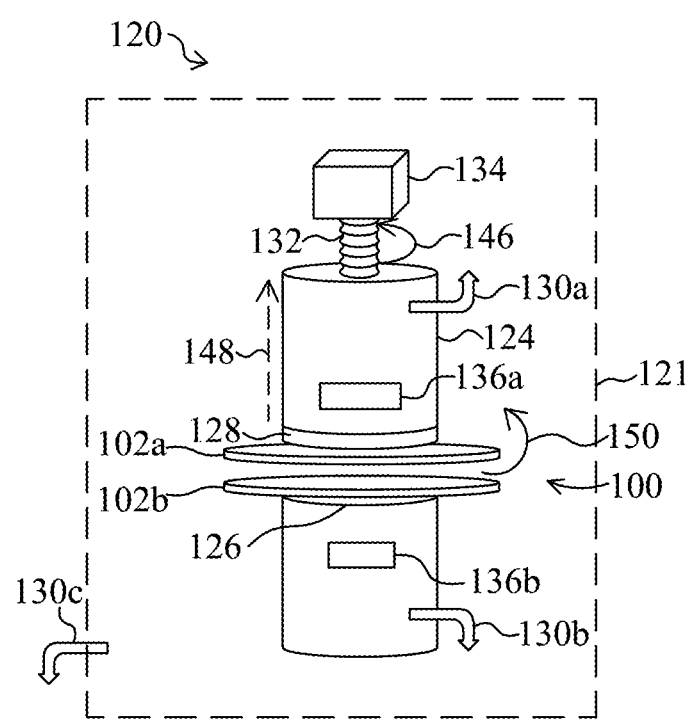

At time $t_3$, the wafers 102a and 102b are separated by moving the servo motor 134 in a reverse direction, causing the ball screw 132 to rotate in the reverse direction and cause upward movement 148 of the second stage 124, as shown in FIG. 7. The second stage 124 also rotates as it is raised. The reverse rotation 146 of the ball screw 132 creates a sheer force 150 which is applied to the bonded wafers 100, e.g., to the top wafer 102a of the bonded wafers 100. The sheer force 150 contributes to the separation of the bonded wafers 100, causing the wafers 102a and 102b to twist apart, for example. The sheer force 150 comprises applying an energy of about 0.3 to 50 $J/m^2$ of a twisting force to the top wafer 102a in some embodiments, for example, although alternatively, other levels of energy may be used to separate the wafers 102a and 102b. In other embodiments, an energy of greater than about 50 $J/m^2$ of twisting force is applied to the bonded wafers 100, as another example. The rotation 146 and upward movement 148 are continued to lift the top wafer 102a and complete the de-bonding process. The second stage 124 is moved upwards until it reaches the up position at time $t_4$. The servo motor 134 may then be turned off or de-activated, and the de-bonding procedure is concluded. Alternatively, the servo motor 134 may remain on, and one or more additional bonded wafers 100 may be de-bonded by repeating the procedure described above.

Figure 8:
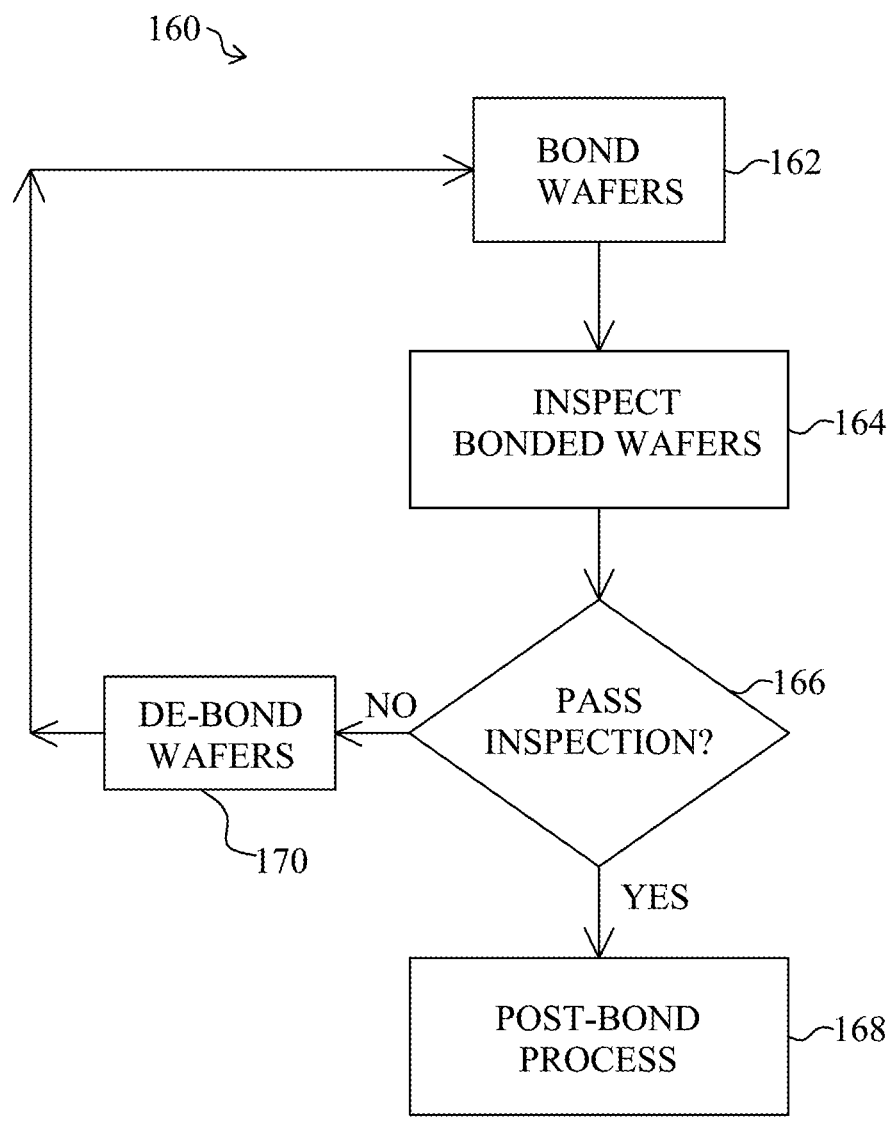
FIG. 8 is a flow chart illustrating a method of de-bonding wafers using the system shown in FIG. 3 in accordance with an embodiment.

FIG. 8 is a flow chart 160 illustrating a method of de-bonding wafers 102a and 102b using the system 120 shown in FIG. 3 in accordance with an embodiment. In step 162, the wafers 102a and 102b are bonded, and in step 164, the bonded wafers 100 are inspected. The bonded wafers 100 may be inspected by an infrared inspection tool, an acoustic microscope such as a C-mode scanning acoustic microscope (C-SAM), or other inspection devices, as examples. A determination is made as to whether the bonded wafers 100 pass inspection in step 166. If the bonded wafers 100 are determined to pass inspection, a post-bond process is performed on the bonded wafers 100, in step 168. The post-bonding process may comprise an anneal process that strengthens the insulator-to-insulator bonds 112 and/or the metal-to-metal bonds 114 of the bonded wafers 100, as an example. Alternatively, other types of post-bonding processes may be used. If the bonded wafers 100 do not pass inspection, the wafers 102a and 102b are de-bonded using the system 120 and methods described herein, in step 170. Step 162 may then be repeated to re-bond the wafers 102a and 102b, in some embodiments.

Figure 9:
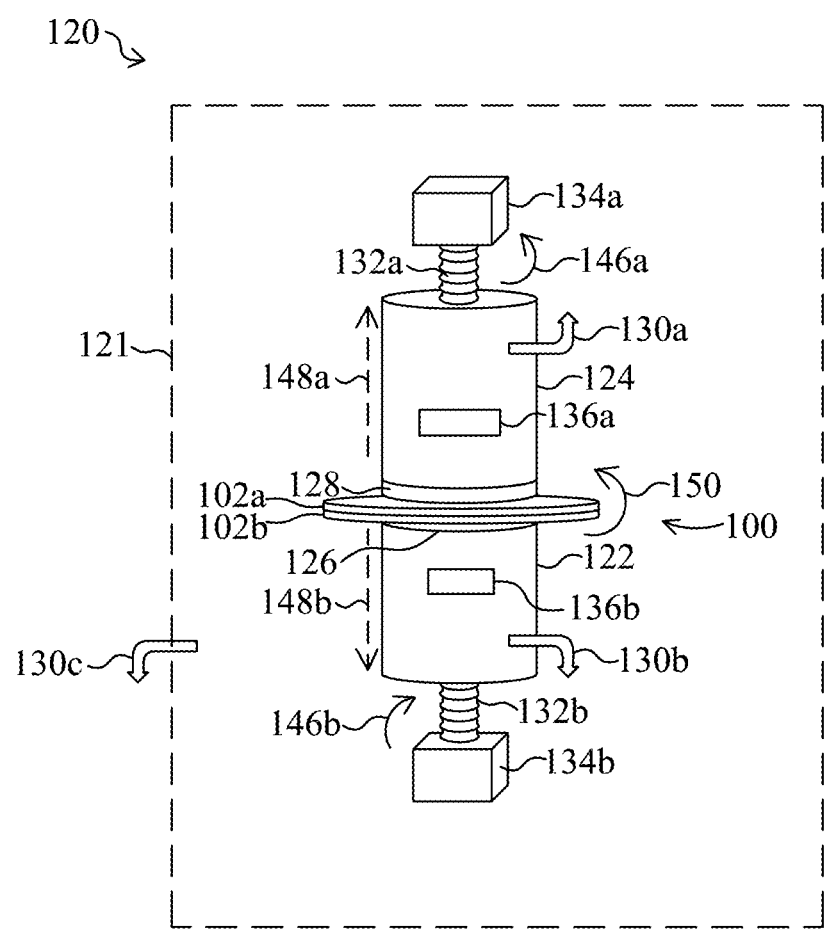
FIG. 9 is an illustration of a system for separating wafers in accordance with another embodiment.

FIG. 9 is an illustration of a system 120 for separating wafers 102a and 102b in accordance with another embodiment. The first stage 122 and the second stage 124 are both moveable in this embodiment. A ball screw 132b is coupled to the first stage 122, and a servo motor 134b is coupled to the ball screw 132b. During the separation of the wafers 102a and 102b (e.g., at time $t_3$ of the graph 140 in FIG. 4), the second stage 124 is moved in an upward direction 148a by the rotation 146a of the ball screw 132a and servo motor 134a, simultaneously while the first stage 122 is moved in a downward direction 148b by the rotation 146b of the ball screw 132b and servo motor 134b. The first stage 122 and the second stage 124 may be rotated in opposite directions or in the same directions, increasing the sheer force 150 in this embodiment, for example.

In another embodiment, the first stage 122 is moveable and the second stage 124 is fixed, not shown in the drawings. A ball screw 132b is coupled to the first stage 122, and a servo motor 134b is coupled to the ball screw 132b. Either the first stage 122 is moveable and adapted to produce the sheer force 150 as shown in FIG. 3, the second stage 124 is moveable and adapted to produce the sheer force 150, or both the first stage 122 and the second stage 124 are moveable and adapted to produce the sheer force 150 that is utilized in separating the wafers 102a and 102b (shown in FIG. 9), in accordance with embodiments herein.

Embodiments of the present disclosure include methods of de-bonding or separating bonded wafers 120. Embodiments of the present disclosure also include novel systems 120 for de-bonding bonded wafers 120. Although bonded wafers 100 are shown in the drawings that include only two wafers 102a and 102b bonded together, the systems 120 and methods described herein may also be used to de-bond three or more wafers 102a and 102b that have been bonded together, not shown in the drawings. The de-bonding methods can be repeated two or more times until each of the wafers 102a and 102b in the stack of wafers have been de-bonded, for example.

Advantages of embodiments of the disclosure include providing novel systems 120 and methods of detaching wafers that have been bonded together apart from one another. The methods comprise mechanical methods of de-bonding bonded wafers 102a and 102b, allowing rework and/or re-bonding after the de-bonding process of one or more of the bonded wafers 100, providing a cost savings and increased yields. The wafers 102a and 102b are pulled apart using a vacuum applied to both wafers 102a and 102b at the top and bottom, respectively, and the separation of the wafers 102a and 102b is facilitated by the sheer force 150 applied. The sheer force 150 applied to the bonded wafers 100 effectively assists in separating the wafers 102a and 102b without damaging the wafers 102a and 102b. Mechanical conduction from the servo motor 134 and ball screw 132 are used to generate the twisting sheer force 150 that facilitates the wafer 102a and 102b separation. The twisting sheer force 150 advantageously easily separates the bonding interfaces comprising the metal-to-metal bonds 114 and/or insulator-to-insulator bonds 112 of the wafers 102a and 102b.

The servo motor 134 and ball screw 132 provide linear movement combined with rotation of the vacuum that is precisely controllable and provides sufficient power for the bonding energy. The bonding strength required to separate the wafers 102a and 102b is obtainable by precisely calculating a reverse impedance of the servo motor 134, for example.

The de-bonding process is advantageously performed in a high vacuum chamber 121 in some embodiments, which avoids a requirement for the use of high force concentrations that may damage the wafers 102a and 102b. By using substantially the same vacuum or pressure level that was used to bond the wafers 102a and 102b as an ambient pressure in the chamber 121, the inner and outer pressure between the bonded wafers 100 and the chamber 121 environment is balanced, and a lower amount of sheer force 150 may be used to separate the wafers 102a and 102b, for example. The balanced pressure also smoothes the rework process. Furthermore, by de-bonding the wafers 102a and 102b soon after they are bonded and before any heat is applied by an anneal process, damage to the wafers 102a and 102b is further avoided.

Bonded wafers 100 that in the past could not be reworked are advantageously de-bondable and re-workable by the use of the novel systems 120 and methods described herein.

In accordance with one embodiment of the present disclosure, a system for separating bonded wafers includes a support for the bonded wafers, means for applying a sheer force to the bonded wafers, and means for applying a vacuum to the bonded wafers.

In accordance with another embodiment, a system for separating bonded semiconductor wafers includes a chamber and a first stage disposed in the chamber. The first stage includes a first vacuum line and is adapted to support the bonded semiconductor wafers. The system includes a second stage disposed in the chamber proximate the first stage, the second stage including a second vacuum line. A ball screw is coupled to the first stage or the second stage, and a servo motor is coupled to the ball screw. The system includes a third vacuum line coupled to the chamber.

In accordance with yet another embodiment, a method of separating bonded wafers includes placing the bonded wafers on a support. The bonded wafers include a top wafer and a bottom wafer coupled to the top wafer. The method includes applying a twisting force to the top wafer to separate the bonded wafers.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
   a support for bonded wafers;
   a debonding mechanism configured to apply a first twisting sheer force to a top wafer of the bonded wafers and a second twisting sheer force to a bottom wafer of the bonded wafers;
   a first vacuum mechanism configured to apply a vacuum to the bonded wafers;

a chamber enclosing the support and the debonding mechanism; and a second vacuum mechanism configured to apply a vacuum to the chamber.

2. The system according to claim 1, wherein the first vacuum mechanism is adapted to lift the top wafer of the bonded wafers from the bottom wafer of the bonded wafers disposed on the support for the bonded wafers.

3. The system according to claim 1, wherein the first vacuum mechanism comprises a first vacuum submechanism configured to apply a first vacuum and a second vacuum submechanism configured to apply a second vacuum.

4. The system according to claim 3, wherein the first vacuum submechanism is adapted to apply the first vacuum to the top wafer of the bonded wafers, and wherein the second vacuum submechanism is adapted to apply the second vacuum to the bottom wafer of the bonded wafers.

5. A system for separating bonded semiconductor wafers, the system comprising:
 a chamber;
 a first stage disposed in the chamber, the first stage including a first vacuum line and being adapted to support the bonded semiconductor wafers;
 a second stage disposed in the chamber proximate the first stage, the second stage including a second vacuum line;
 a first ball screw coupled to the second stage;
 a first servo motor for applying a first twisting sheer force coupled to the first ball screw;
 a second ball screw coupled to the first stage;
 a second servo motor for applying a second twisting sheer force coupled to the second ball screw; and
 a third vacuum line coupled to the chamber.

6. The system according to claim 5, wherein the second vacuum line is coupled to a vacuum disk.

7. The system according to claim 5, wherein the first stage and the second stage are moveable.

8. The system according to claim 5, wherein at least one of the first stage and the second stage includes a heater.

9. A method comprising:
 placing bonded wafers on a support disposed in a chamber, the bonded wafers including a top wafer and a bottom wafer coupled to the top wafer;
 applying a first twisting force to the top wafer and a second twisting force to the bottom wafer to separate the bonded wafers; and
 applying a vacuum to the chamber.

10. The method according to claim 9, wherein applying the first twisting force or the second twisting force comprises applying a sheer force comprising an energy of about 0.3 to 50 $J/m^2$ to the top wafer or the bottom wafer, respectively.

11. The method according to claim 9, wherein applying the vacuum comprises applying a vacuum of about 0.01 to 955 mbar.

12. The method according to claim 9, further comprising placing the bonded wafers on the support and applying the first twisting force and the second twisting force about an hour or less after the wafers are bonded together.

13. The method according to claim 9, further comprising placing the bonded wafers on the support and applying the first twisting force and the second twisting force before the bonded wafers are annealed.

14. The method according to claim 9, further comprising heating the bonded wafers to a temperature of about 600 degrees C. or less while applying the first twisting force to the top wafer and the second twisting force to the bottom wafer to separate the bonded wafers.

15. The method according to claim 9, further comprising inspecting the bonded wafers before placing the bonded wafers on the support and applying the first twisting force and the second twisting force.

16. The method according to claim 9, further comprising reworking the top wafer or the bottom wafer, and re-bonding the top wafer to the bottom wafer after applying the first twisting force to the top wafer and the second twisting force to the bottom wafer to separate the bonded wafers.

\* \* \* \* \*